(12) United States Patent
Lee et al.

(10) Patent No.: US 8,048,809 B2
(45) Date of Patent: Nov. 1, 2011

(54) POLISHING METHOD USING CHEMICAL MECHANICAL SLURRY COMPOSITION

(75) Inventors: Hyo-Jin Lee, Seoul (KR); Kyung-Hyun Kim, Seoul (KR); Yong-Sun Ko, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 1079 days.

(21) Appl. No.: 11/898,850

(22) Filed: Sep. 17, 2007

(65) Prior Publication Data

US 2008/0009136 A1 Jan. 10, 2008

Related U.S. Application Data

(62) Division of application No. 11/168,412, filed on Jun. 29, 2005, now Pat. No. 7,271,100.

(30) Foreign Application Priority Data

Jul. 15, 2004 (KR) .................................. 2004-55203

(51) Int. Cl.
H01L 21/302 (2006.01)
(52) U.S. Cl. ..... 438/692; 252/79.1; 252/79.2; 252/79.3; 252/79.4; 438/689; 438/693; 438/745; 438/753
(58) Field of Classification Search ........ 252/79.1–79.4; 438/689, 692, 693, 745, 753
See application file for complete search history.

(56) References Cited

U.S. PATENT DOCUMENTS

| | | | |
|---|---|---|---|
| 6,245,642 B1 | 6/2001 | Satoh | |
| 6,540,935 B2 | 4/2003 | Lee et al. | |
| 6,706,633 B2 | 3/2004 | Chung et al. | |
| 6,833,084 B2 * | 12/2004 | Mercaldi et al. | 252/79.1 |
| 6,863,592 B2 | 3/2005 | Lee et al. | |
| 7,029,509 B2 * | 4/2006 | Kim et al. | 51/308 |
| 2005/0130428 A1 * | 6/2005 | Choi et al. | 438/690 |
| 2006/0124591 A1 * | 6/2006 | Haga et al. | 216/88 |

FOREIGN PATENT DOCUMENTS

| | | |
|---|---|---|
| KR | 10-2002-0009747 | 2/2002 |
| KR | 10-2002-0051296 | 6/2002 |
| KR | 10-2002-0082960 | 11/2002 |
| KR | 10-2004-0016154 | 2/2004 |

* cited by examiner

*Primary Examiner* — Lan Vinh
*Assistant Examiner* — Maki Angadi
(74) *Attorney, Agent, or Firm* — Lee & Morse, P.C.

(57) ABSTRACT

A slurry composition includes about 4.25 to about 18.5 weight percent of an abrasive, about 80 to about 95 weight percent of deionized water, and about 0.05 to about 1.5 weight percent of an additive. The slurry composition may further include a surfactant. In a polishing method using the slurry composition, a polysilicon layer may be rapidly polished, and also dishing and erosion of the polysilicon layer may be suppressed.

21 Claims, 10 Drawing Sheets

POLISHING METHOD USING CHEMICAL MECHANICAL SLURRY COMPOSITION

CROSS REFERENCE TO RELATED APPLICATION

This is a divisional application based on application Ser. No. 11/168,412, filed Jun. 29, 2005 now U.S. Pat. No. 7,271,100, the entire contents of which is hereby incorporated by reference.

BACKGROUND OF THE INVENTION

1. Field of the Invention

The present invention relates to a slurry composition, a polishing method using the slurry composition, and a method of forming a gate pattern using the slurry composition. More particularly, the present invention relates to a slurry composition for polishing a polysilicon layer in a chemical mechanical polishing process, a polishing method using the slurry composition, and a method of forming a gate pattern using the slurry composition.

2. Description of the Related Art

A multi-layer wiring structure is typically employed in a semiconductor device, as the semiconductor device is required to have high capacity and a high degree of integration. The multi-layer wiring structure is generally formed through repeatedly performing processes for forming a conductive layer, and an insulation layer and through repeatedly performing etching processes for patterning the conductive layer and the insulation layer. After the conductive layer and the insulation layer are etched to form a conductive layer pattern and an insulation layer pattern, planarization processes are carried out about the conductive layer pattern and the insulation layer pattern. Successive photolithography processes for forming the conductive layer pattern and the insulation layer pattern may be more efficiently performed when the patterns are so planarized.

Planarization processes are typically divided into a local planarization process or a global planarization process. Etch-back, reflow and chemical mechanical polishing processes are typical planarization processes.

The chemical mechanical polishing (CMP) process is usually employed for forming integrated circuits having a high degree of integration, because the chemical mechanical polishing process efficiently performs global planarization of the polished layers. The chemical mechanical polishing process, as developed by International Business Machines (IBM) Corp., typically involves a semiconductor substrate disposed beneath a polishing head of a chemical mechanical polishing and a polishing pad positioned under the semiconductor substrate. A slurry composition, including deionized water, an abrasive and an additive, is provided onto the semiconductor substrate. The semiconductor substrate and the polishing pad may be moved with respect to each other while the polishing pad makes contact with the semiconductor substrate so that a surface portion of the semiconductor substrate is planarized. The abrasive of the slurry composition and protrusions of the polishing pad may mechanically polish the surface portion of the semiconductor substrate. Simultaneously, the surface portion of the semiconductor substrate is chemically polished by reactions between chemical components included in the slurry composition and ingredients in the surface portion of the semiconductor substrate.

A polishing efficiency of the chemical mechanical polishing process may be determined by multiple factors, including the nature of the chemical mechanical polishing apparatus, the make-up of the slurry composition, and type of the polishing pad. Typically, the polishing efficiency is mainly determined by the slurry composition.

In forming a gate pattern of a semiconductor device, a polysilicon layer is typically formed on a silicon oxide layer pattern, the silicon oxide layer serving as a polishing stop layer. Then, the polysilicon layer is polished.

A processing time of the chemical mechanical polishing process on the polysilicon layer may be lengthened, however, if a slurry composition having a low removal rate of the polysilicon layer is used in the chemical mechanical polishing process. In addition, when the silicon oxide layer pattern is exposed by removal of a portion of the polysilicon layer, which is positioned on the silicon oxide layer, erosion or dishing of the polysilicon layer may occur at a surface portion of the polysilicon layer and/or a surface portion of a semiconductor substrate.

FIG. 1 illustrates a cross-sectional view of a wafer, showing erosion and dishing of the polysilicon layer. FIG. 2 illustrates an enlarged cross-sectional view of a wafer, showing a portion "A" of FIG. 1.

Referring to FIGS. 1 and 2, recesses may be formed across a whole surface portion of a polysilicon layer 102 during a chemical mechanical polishing process. The recesses generated across the whole surface portion of the polysilicon layer 102 are defined as erosion of the polysilicon layer 102. As illustrated in FIG. 2, recesses may also be formed locally at portions of the polysilicon layer 102. Such recesses are defined as dishing of the polysilicon layer 102.

When a polishing selectivity between the polysilicon layer 102 and a polishing stop layer pattern 101 is low, erosion of the polysilicon layer 102 may easily occur. In addition, when the polishing selectivity is low, polishing of the polishing stop layer pattern 101 may readily occur, concurrently with polishing of the polysilicon layer 102. That is, the polishing stop layer pattern 101 may not precisely stop polishing of the polysilicon layer 102, so that erosion of the polysilicon layer 102 may occur. Furthermore, erosion of the polysilicon layer 102 may increase a height difference between a maximum height (h1) and a minimum height (h2) in the polysilicon layer 102. As a result, polishing uniformity of the polysilicon layer 102 may decrease.

In contrast, when the polishing selectivity is high, chemical components included in the slurry composition chemically polish the polysilicon layer 102, while the polishing stop layer pattern 101 may prevent mechanical polishing of the polysilicon layer 102 by the polishing pad. As a result of this imbalance between the chemical and mechanical aspects of the chemical mechanical polish, dishing of the polysilicon layer 102 may occur, as illustrated in FIG. 2.

SUMMARY OF THE INVENTION

The present invention is therefore directed to slurry compositions and polishing methods, which substantially overcome one or more of the problems due to the limitations and disadvantages of the related art.

It is therefore a feature of an embodiment of the present invention to provide slurry compositions having high removal rates of polysilicon layers.

It is therefore another feature of an embodiment of the present invention to provide polishing methods using the slurry compositions.

It is therefore also a feature of an embodiment of the present invention to provide a method of forming a gate pattern using the slurry compositions.

At least one of the above and other features and advantages of the present invention may be realized by providing a slurry composition including about 4.25 to about 18.5 weight percent of an abrasive, about 80 to about 95 weight percent of deionized water, and about 0.05 to about 1.5 weight percent of an additive.

The slurry composition may have an abrasive including at least one material selected from the group consisting of silica, ceria, alumina, titania, zirconia and germania. The slurry composition may have an additive including at least one material selected from the group consisting of potassium hydroxide, sodium hydroxide, ammonium hydroxide, and an amine compound. The amine compound may include at least one material selected from the group consisting of quaternary ammonium, quaternary ammonium salt, ethanol amine, dimethanolamine, trimethanol amine, ethylene diamine, cetyltrimethyl ammonium bromide, and cetylpyridinium chloride. The quaternary ammonium may include at least one material selected from the group consisting of tetramethyl ammonium hydroxide, tetraethyl ammonium hydroxide, tetramethyl ammonium chloride, tetraethyl ammonium chloride, tetramethyl ammonium fluoride, and tetraethyl ammonium fluoride.

At least one of the above and other features and advantages of the present invention may also be realized by providing a slurry composition including about 4.25 to about 18.5 weight percent of an abrasive, about 80 to about 95 weight percent of deionized water, about 0.01 to about 1.0 weight percent of an additive, and about 0.74 to about 2.0 weight percent of a surfactant. The surfactant may include a nonionic polymer. The nonionic polymer may include at least one material selected from the group consisting of a block copolymer of polyethylene glycol and polypropylene glycol, a random copolymer of polyethylene glycol and polypropylene glycol, a block copolymer of polyethylene oxide and polypropylene oxide, and a random copolymer of polyethylene oxide and polypropylene oxide. The nonionic polymer may have a chemical formula of $H-(OCH_2CH_2)_x-(OCH(CH_3)CH_2)_y-(OCH_2CH_2)_z-OH$, wherein x, y, and z are positive integers.

At least one of the above and other features and advantages of the present invention may further be realized by providing a polishing method including providing a slurry composition onto a polysilicon layer, the slurry composition comprising about 4.25 to about 18.5 weight percent of an abrasive, about 80 to about 95 weight percent of deionized water, and about 0.05 to about 1.5 weight percent of an additive, and polishing the polysilicon layer by a chemical mechanical polishing process.

Additionally, at least one of the above and other features and advantages of the present invention may be realized by providing a polishing method including providing a wafer having a polysilicon layer formed on a silicon oxide pattern, providing a slurry composition onto the polysilicon layer, wherein the slurry composition includes about 4.25 to about 18.5 weight percent of an abrasive, about 80 to about 95 weight percent of deionized water, about 0.01 to about 1.0 weight percent of an additive, and about 0.74 to about 2.0 weight percent of a surfactant, and polishing the polysilicon layer by a chemical mechanical polishing process until the silicon oxide pattern is exposed.

At least one of the above and other features and advantages of the present invention may also be realized by providing a polishing method including providing a first slurry composition onto a polysilicon layer covering a silicon oxide pattern, the first slurry composition comprising about 4.25 to about 18.5 weight percent of an abrasive, about 80 to about 95 weight percent of deionized water, and about 0.05 to about 1.5 weight percent of an additive, and polishing the polysilicon layer, without exposing the silicon oxide pattern, using the first slurry composition, providing a second slurry composition onto the polysilicon layer, the second slurry composition comprising about 4.25 to about 18.5 weight percent of an abrasive, about 80 to about 95 weight percent of deionized water, about 0.01 to about 1.0 weight percent of an additive, and about 0.74 to about 2.0 weight percent of a surfactant, and polishing the polysilicon layer using the second slurry composition until the silicon oxide pattern is exposed.

At least one of the above and other features and advantages of the present invention may further be realized by providing a method for forming a gate pattern including forming a silicon nitride layer pattern on a tunnel oxide layer formed on a substrate, forming a tunnel oxide layer pattern and a trench by partially etching the tunnel oxide layer and the substrate using the silicon nitride layer pattern as an etching mask, forming an oxide layer on the tunnel oxide layer pattern and filling the trench with the oxide layer, polishing the oxide layer until the silicon nitride layer pattern is exposed to form an isolation pattern in the trench, removing the silicon nitride layer pattern, forming a polysilicon layer on the isolation pattern and the tunnel oxide layer pattern, providing a first slurry composition, the first slurry composition comprising about 4.25 to about 18.5 weight percent of an abrasive, about 80 to about 95 weight percent of deionized water, and about 0.05 to about 1.5 weight percent of an additive, polishing the polysilicon layer using the first slurry composition, without exposing the isolation pattern and without exposing the tunnel oxide layer pattern, providing a second slurry composition, the second slurry composition comprising about 4.25 to about 18.5 weight percent of an abrasive, about 80 to about 95 weight percent of deionized water, about 0.01 to about 1.0 weight percent of an additive, and about 0.74 to about 2.0 weight percent of a surfactant, and polishing the polysilicon layer using the second slurry composition until the silicon oxide layer pattern is exposed.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
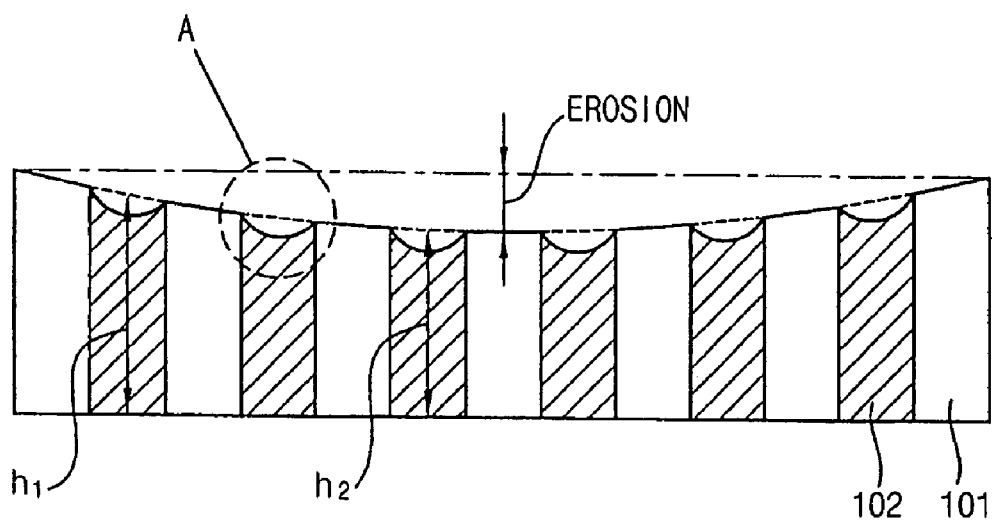
FIG. 1 illustrates a cross-sectional view of a wafer, showing erosion and dishing of the polysilicon layer.
Figure 2:
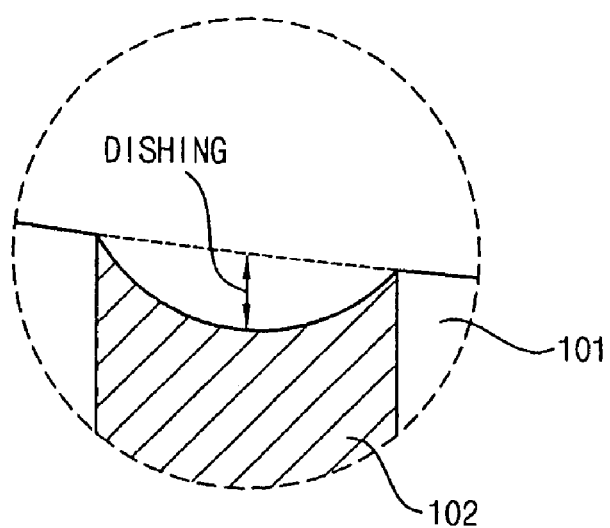
FIG. 2 illustrates an enlarged cross-sectional view of a wafer, showing a portion "A" of FIG. 1.

Korean Patent Application No. 2004-55203, filed on Jul. 15, 2004, in the Korean Intellectual Property Office, and entitled: "SLURRY COMPOSITION, POLISHING METHOD USING THE SLURRY COMPOSITION AND METHOD OF FORMING A GATE PATTERN USING THE SLURRY COMPOSITION," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions are exaggerated for clarity of illustration. Like numbers refer to like elements throughout.

It will also be understood that when an element or layer is referred to as being "on," "connected to" or "coupled to" another element or layer, it can be directly on, connected or coupled to the other element or layer, or intervening elements or layers may also be present. In contrast, when an element is referred to as being "directly on," "directly connected to" or "directly coupled to" another element or layer, there are no intervening elements or layers present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. As used herein, the term "and/or" includes any and all combinations of one or more of the associated listed items.

It will be understood that, although terms such as "first," "second," "third," etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description, to describe a relationship between one element or feature and another element or feature. It will be understood that such spatially relative terms are also intended to encompass additional orientations of the elements in use or operation, beyond those orientations which may be illustrated in the figures. For example, if a device illustrated in a figure is turned over, elements described as "below" or "beneath" other elements or features would then be oriented "above" the other elements or features. Thus, the exemplary term "below" can encompass both an orientation of above and below. Further, the device may be otherwise oriented (e.g., rotated 90 degrees or at other orientations) and the spatially relative descriptors used herein interpreted accordingly.

The terminology used herein is for the purpose of describing particular embodiments only and is not intended to limit the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention may be described herein with reference to cross-section illustrations that are schematic illustrations of idealized embodiments (and intermediate structures) of the invention. As such, variations from the shapes of the illustrations (as a result, e.g., of manufacturing techniques and/or tolerances) are to be expected. Thus, embodiments of the invention should not be construed as limited to the particular shapes of regions illustrated herein, but are to include deviations in shapes that result, for example, from manufacturing. For example, an implanted region illustrated as a rectangle may typically have rounded or curved features and/or a gradient of implant concentration at its edges, rather than a binary change from implanted to non-implanted region. Likewise, a buried region formed by implantation may result in some implantation in a region between the buried region and a surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Slurry Composition

A slurry composition of one exemplary embodiment of the present invention includes an abrasive, deionized (DI) water and an additive.

The slurry composition may include about 4.25 to about 18.5 weight percent of the abrasive. Preferably, the content of the abrasive in the slurry composition ranges from about 9.25 to about 18.5 weight percent. If a slurry composition includes less than about 4.25 weight percent of the abrasive, a mechanical polishing rate of a polysilicon layer may be undesirably low. If a slurry composition includes more than about 18.5 weight percent of the abrasive, scratches may be generated at a surface of the polysilicon layer and/or at a surface of a substrate.

In an exemplary embodiment, the abrasive may include silicon oxide ($SiO_2$; silica), cerium oxide ($CeO_2$; ceria), aluminum oxide ($Al_2O_3$; alumina), titanium oxide ($TiO_2$; titania), zirconium oxide ($ZrO_2$; zirconia), germanium oxide ($GeO_2$; germania), etc., which may be used alone or in combination. Preferably, the abrasive includes silica and/or ceria.

The slurry composition may include about 80 to about 95 weight percent of the DI water. Preferably, the content of the DI water in the slurry composition ranges from about 80 to about 90 weight percent. If a slurry composition includes less than about 80 weight percent of the DI water, the viscosity of the slurry composition may increase, which may result in damage to the chemical mechanical polishing apparatus during the chemical mechanical polishing process for the polysilicon layer. If a slurry composition includes more than about 95 weight percent of the DI water, the viscosity of the slurry composition may decrease, which may cause the mechanical polishing rate of the polysilicon layer to decrease.

The slurry composition may include about 0.05 to about 1.5 weight percent of the additive. Preferably, the content of the additive in the slurry composition ranges from about 0.75 to about 1.5 weight percent. If the slurry composition includes less than about 0.05 weight percent of the additive, a chemical polishing rate of the polysilicon layer may decrease to an undesirable extent. If the slurry composition includes more than about 1.5 weight percent of the additive, the chemical polishing rate of the polysilicon layer may be exceedingly high.

In an exemplary embodiment of the present invention, the additive may include potassium hydroxide, sodium hydroxide, ammonium hydroxide, an amine compound, etc., which may be used alone or in combination.

The amine compound may include quaternary ammonium, quaternary ammonium salt, ethanol amine, dimethanolamine, trimethanol amine, ethylene diamine, cetyltrimethyl ammonium bromide, cetylpyridinium chloride, etc., which may be used alone or in combination.

The quaternary ammonium may include tetramethyl ammonium hydroxide, tetraethyl ammonium hydroxide, tetramethyl ammonium chloride, tetraethyl ammonium chloride, tetramethyl ammonium fluoride, tetraethyl ammonium fluoride, etc., which may be used alone or in combination.

The slurry composition may have a pH of about 10 to about 12. Preferably, the pH of the slurry composition ranges from about 10.2 to about 11.8. If the pH of the slurry composition is less than about 10, a chemical reaction between the polysilicon layer and the additive in slurry composition may be suppressed. If the pH of the slurry composition is more than about 12, the chemical mechanical polishing apparatus may be damaged during the chemical mechanical polishing process for the polysilicon layer.

When the chemical mechanical polishing process is performed using slurry compositions of the present invention, the polysilicon layer may be rapidly polished because a removal rate of the polysilicon layer relative to the slurry composition may be high. Thus, a time required for polishing the polysilicon layer may be reduced, and, as a result, the polysilicon layer may be more efficiently polished.

A slurry composition according to another exemplary embodiment of the present invention includes an abrasive, DI water, an additive and a surfactant.

The slurry composition containing the surfactant may include about 4.25 to about 18.5 weight percent of the abrasive. Preferably, the content of the abrasive in the slurry composition containing the surfactant ranges from about 9.25 to about 18.5 weight percent. If the slurry composition containing the surfactant includes less than about 4.25 weight percent of the abrasive, a mechanical polishing rate of a polysilicon layer may be undesirably low. If the slurry composition containing the surfactant includes more than about 18.5 weight percent of the abrasive, scratches may be generated at a surface of the polysilicon layer and/or a surface of a substrate.

Examples of the abrasive may include silica, ceria, alumina, titania, zirconia, germania, etc., which may be used alone or in combination. Preferably, the abrasive includes silica and/or ceria.

The slurry composition containing the surfactant may include about 80 to about 95 weight percent of the DI water. Preferably, the content of the DI water in the slurry composition containing the surfactant ranges from about 80 to about 90 weight percent. If the slurry composition containing the surfactant includes less than about 80 weight percent of the DI water, a viscosity of the slurry composition may increase to the extent that the chemical mechanical polishing apparatus may be damaged during chemical mechanical polishing of the polysilicon layer. If the slurry composition containing the surfactant includes more than about 95 weight percent of the DI water, the viscosity of the slurry composition containing the surfactant may decrease so that the mechanical polishing rate of the polysilicon layer is undesirably low.

The slurry composition containing the surfactant may include about 0.01 to about 1.0 weight percent of the additive. Preferably, the content of the additive in the slurry composition containing the surfactant ranges from about 0.7 to 1.0 weight percent. If the slurry composition containing the surfactant includes less than about 0.01 weight percent of the additive, a chemical polishing rate of the polysilicon layer may be undesirably low. If the slurry composition containing the surfactant includes more than about 1.0 weight percent of the additive, the chemical polishing rate of the polysilicon layer may be exceedingly high.

Examples of the additive may include potassium hydroxide, sodium hydroxide, ammonium hydroxide, an amine compound, etc., which may be used alone or in combination.

Examples of the amine compound may include quaternary ammonium, quaternary ammonium salt, ethanolamine, dimethanolamine, trimethanol amine, ethylene diamine, cetyltrimethyl ammonium bromide, cetylpyridinium chloride, etc., which may be used alone or in combination.

Examples of the quaternary ammonium may include tetramethyl ammonium hydroxide, tetraethyl ammonium hydroxide, tetramethyl ammonium chloride, tetraethyl ammonium chloride, tetramethyl ammonium fluoride, tetraethyl ammonium fluoride, etc., which may be used alone or in combination.

The slurry composition may include about 0.74 to about 2.0 weight percent of the surfactant. Preferably, the content of the surfactant in the slurry composition ranges from about 1.3 to about 2.0 weight percent. If the slurry composition includes less than about 0.74 weight percent of the surfactant, the polysilicon layer may not be properly protected during the chemical mechanical polishing process. If the slurry composition includes more than about 2.0 weight percent of the surfactant, the viscosity of the slurry composition may increase, resulting in a decrease of the polishing rate of the polysilicon layer.

The slurry composition containing the surfactant may have a pH of about 10 to about 12. Preferably, the pH of the slurry composition containing the surfactant ranges from about 10.2 to about 11.8. If a pH of the slurry composition containing the surfactant is less than about 10, a chemical reaction between the polysilicon layer and the additive in the slurry composition containing the surfactant may be undesirably suppressed. If the pH of the slurry composition containing the surfactant is more than about 12, the chemical mechanical polishing apparatus may be damaged during the chemical mechanical polishing process.

Slurry compositions of the present invention have a high polishing selectivity of a polysilicon layer relative to a silicon oxide layer. That is, slurry compositions of the present invention may have a removal rate of the polysilicon layer that is substantially higher than that of the silicon oxide layer. Thus, when the chemical mechanical polishing process is performed on the polysilicon layer using slurry compositions of the present invention, erosion of the polysilicon layer due to a low polishing selectivity between polysilicon and silicon oxide may be prevented. Thus, polishing uniformity of the polysilicon layer on the substrate may be improved.

When a chemical mechanical polishing process is performed using a slurry composition having a high polishing selectivity between a polysilicon layer and a silicon oxide layer, dishing may frequently occur at a surface portion of the polishing layer.

In slurry compositions of the present invention, the surfactant is added to the slurry composition to help prevent dishing on the polysilicon layer. The surfactant may advantageously include a nonionic polymer having a hydrophilic portion and a hydrophobic portion.

Examples of the nonionic polymer may include a block copolymer of polyethylene glycol and polypropylene glycol, a random copolymer of polyethylene glycol and polypropylene glycol, a block copolymer of polyethylene oxide and polypropylene oxide, a random copolymer of polyethylene oxide and polypropylene oxide, etc., which may be used alone or in combination. An exemplary chemical formula of the nonionic polymer is $H-(OCH_2CH_2)_x-(OCH(CH_3)CH_2)_y-(OCH_2CH_2)_z-OH$, wherein x, y, and z are positive integers, respectively.

The nonionic polymer included in the surfactant may effectively protect a surface of the polysilicon layer in the chemical mechanical polishing process. A protection mechanism of the nonionic polymer relative to the polysilicon layer will be described. The description provided is but one possible protection mechanism, and the present invention is not limited thereto.

Figure 3:
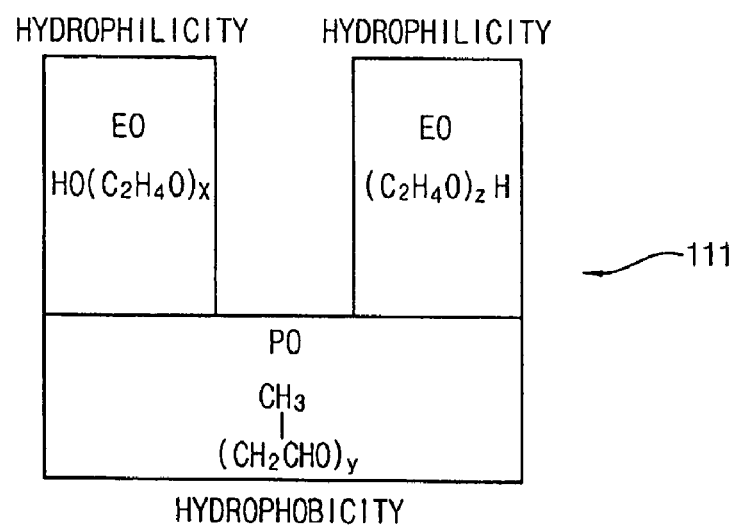
FIG. 3 illustrates a schematic view of a chemical structure of a nonionic polymer included in a surfactant, in accordance with an exemplary embodiment of the present invention.
Figure 4:
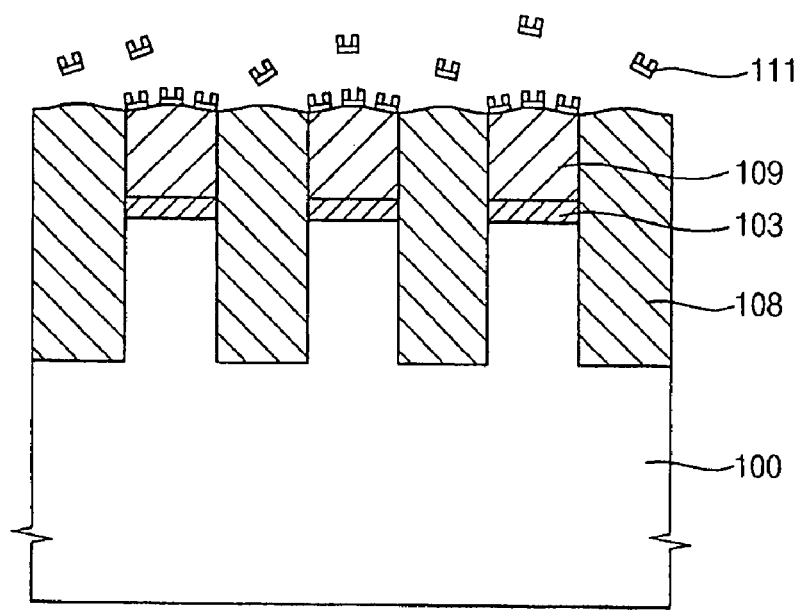
FIG. 4 illustrates a cross-sectional view of a possible protection mechanism of a nonionic polymer, included in a surfactant, relative to a polysilicon layer, in accordance with an exemplary embodiment of the present invention.

FIG. 3 illustrates a schematic view of a chemical structure of a nonionic polymer 111 contained in a surfactant, in accordance with an exemplary embodiment of the present invention. FIG. 4 illustrates a cross-sectional view of a possible protection mechanism of a nonionic polymer included in a surfactant, relative to a polysilicon layer 109, in accordance with an exemplary embodiment of the present invention.

Referring to FIG. 3, the nonionic polymer 111 may include a propylene oxide (PO) unit and an ethylene oxide (EO) unit. The propylene oxide unit (e.g., a block or chain) PO has a hydrophobic property, whereas the ethylene oxide unit (e.g., a block or chain) EO has a hydrophilic property.

Referring to FIG. 4, a tunnel oxide layer pattern 103a, a polysilicon layer 109 (to be polished), and a silicon oxide layer pattern 108a (corresponding to a polishing stopping layer pattern) are formed on a semiconductor substrate 100.

When the silicon oxide layer pattern 108a is exposed during chemical mechanical polishing of the polysilicon layer 109, dishing, due to a high polishing selectivity between polysilicon and silicon oxide, may occur at a surface portion of the polysilicon layer 109. The possible protection mechanism of the nonionic polymer 111, whereby dishing of a surface portion of polysilicon layer 109 is suppressed, may involve a hydrophobic propylene oxide unit PO of the nonionic polymer 111, which has a hydrophobic property, becoming attached to a surface of the polysilicon layer 109, which also has a hydrophobic property. Once the nonionic polymer 111 has attached to the surface of the polysilicon layer 109, it may suppress a chemical reaction between the polysilicon layer 109 and an alkaline component included in the above slurry composition.

Thus, although a slurry composition containing a surfactant having a high polishing selectivity between polysilicon and silicon oxide is used in the chemical mechanical polishing process for the polysilicon layer 109, dishing may not occur at the surface portion of the polysilicon layer 109 because the nonionic polymer 111 effectively protects the polysilicon layer 109. In addition, when the chemical mechanical polishing process is performed using a slurry composition containing a surfactant that includes the nonionic polymer 111, erosion of the polysilicon layer 109 may be suppressed. Therefore, polishing uniformity of the polysilicon layer 109, formed on the semiconductor substrate 100, may be improved.

Chemical Mechanical Polishing Process

Figure 5:
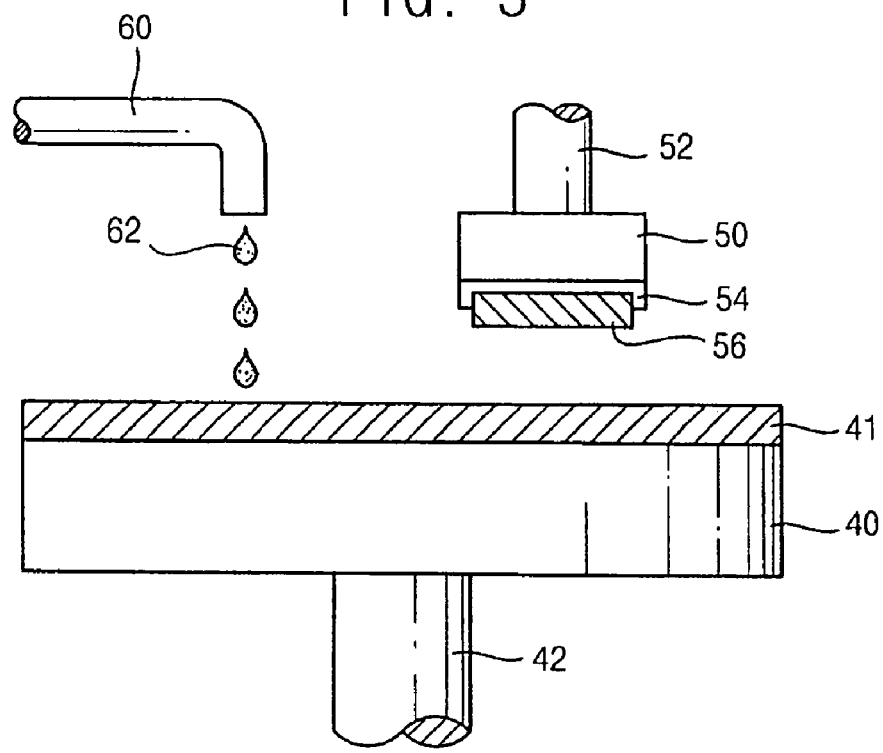
FIG. 5 illustrates a cross-sectional view of a chemical mechanical polishing apparatus employed in a polishing method, in accordance with an exemplary embodiment of the present invention.

FIG. 5 illustrates a cross-sectional view of a chemical mechanical polishing apparatus employed in a chemical mechanical polishing process, in accordance with an exemplary embodiment of the present invention.

Referring to FIG. 5, a polishing table 40 having a polishing pad 41 thereon is connected to a first rotating axial member 42. The first rotating axial member 42 is coupled to a first motor (not shown) that causes the polishing table 40 to revolve. A polishing head 50 having a substrate 56 fixed thereon is positioned over the polishing pad 41. The polishing head 50 is connected to a second rotating axial member 52. The second rotating axial member 52 is coupled to a second motor (not shown) that causes the polishing head 50 to revolve. Preferably, a rotating direction of the polishing head 50 is substantially opposed to a rotating direction of the polishing table 40. The substrate 56 is fixed beneath the polishing head 50 by a lower clamp 54 of the polishing head 50. A slurry supplier 60 provides the polishing table 40 with a slurry composition 62.

Figure 6:
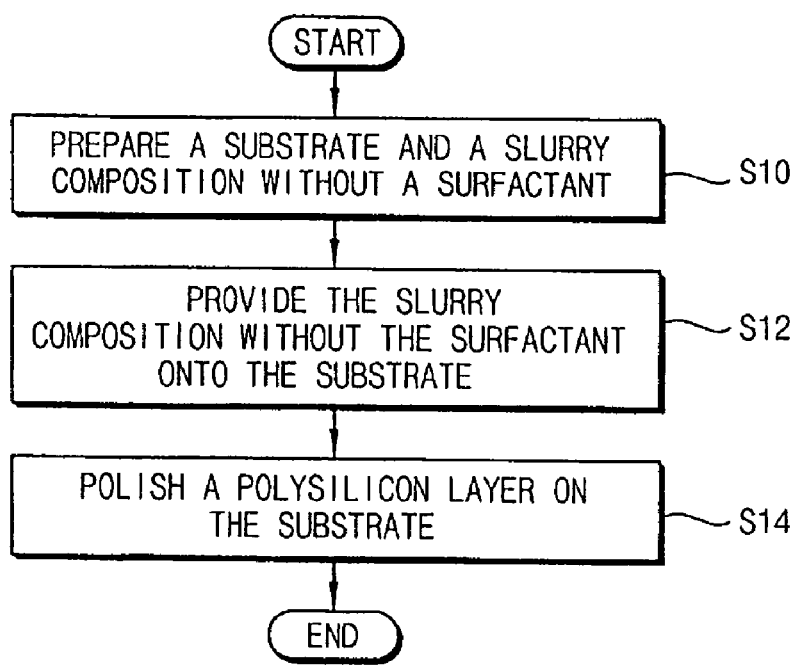
FIG. 6 illustrates a flow chart of a polishing method, in accordance with an exemplary embodiment of the present invention.

FIG. 6 illustrates a flow chart of a polishing method, in accordance with an exemplary embodiment of the present invention.

Referring to FIGS. 5 and 6, in step 10, the substrate 56 and the above slurry composition without the surfactant are prepared. The substrate 56 may include a silicon oxide layer pattern and a polysilicon layer formed the silicon oxide layer pattern. The silicon oxide layer pattern may correspond to a polishing stop layer pattern. The polysilicon layer is to be polished using the slurry composition, which lacks a surfactant.

In step 12, the substrate 56 is placed beneath the polishing head 50, and then the slurry composition without the surfactant is provided onto the substrate 56.

In step 14, a chemical mechanical polishing process is performed on the polysilicon layer on the substrate 56 until a surface of the silicon oxide layer pattern is exposed. During the chemical mechanical polishing process, the substrate 56 and the polishing pad 41 may be moved relative to each other while the polishing pad 41 makes contact with the substrate 56.

Since the chemical mechanical polishing process is performed using a slurry composition that lacks a surfactant, the polysilicon layer on the substrate 56 may be rapidly polished. Thus, the time required for polishing the polysilicon layer may be reduced.

Figure 7:
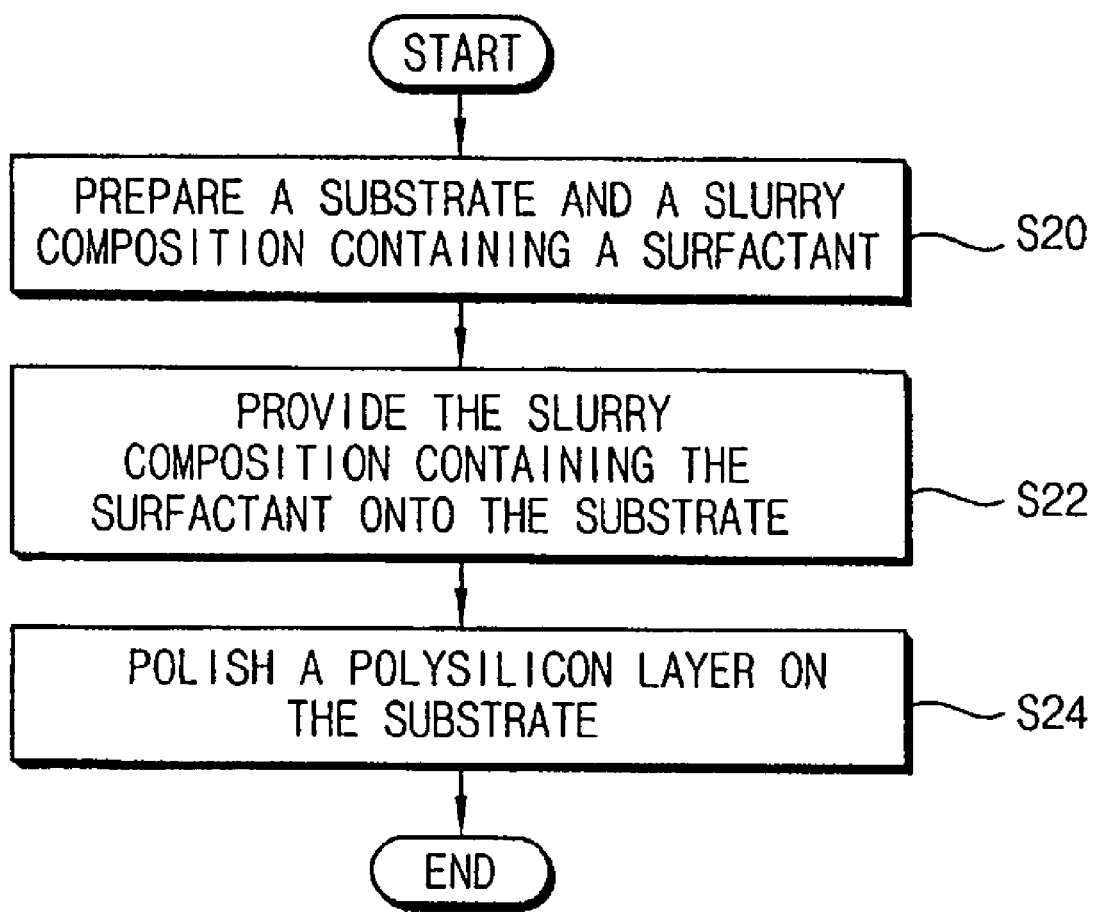
FIG. 7 illustrates a flow chart of a polishing method, in accordance with an exemplary embodiment of the present invention.

FIG. 7 illustrates a flow chart of a polishing method, in accordance with an exemplary embodiment of the present invention.

Referring to FIGS. 5 and 7, in step 20, a substrate 56 and a slurry composition containing a surfactant are prepared. The substrate 56 may include a silicon oxide layer pattern and a polysilicon layer formed the silicon oxide layer pattern. The silicon oxide layer pattern may serve as a polishing stop layer pattern. The polysilicon layer is polished using the slurry composition, which contains the surfactant.

In step 22, the substrate 56 is positioned beneath the polishing pad 50, and then the slurry composition containing the surfactant is provided onto the substrate 56.

In step 24, a chemical mechanical polishing process is performed on the polysilicon layer on the substrate 56 until the silicon oxide layer pattern is exposed. In the chemical mechanical polishing process, the substrate 56 and the polishing pad 41 may be moved with respect to each other while the polishing pad 41 makes contact with the substrate 56.

Because the chemical mechanical polishing process is performed using the slurry composition that contains a surfactant, dishing of the polysilicon layer may be suppressed and erosion of the polysilicon layer may be reduced or prevented. Thus, polishing uniformity of the polysilicon layer on the substrate 56 may be improved.

Figure 8:
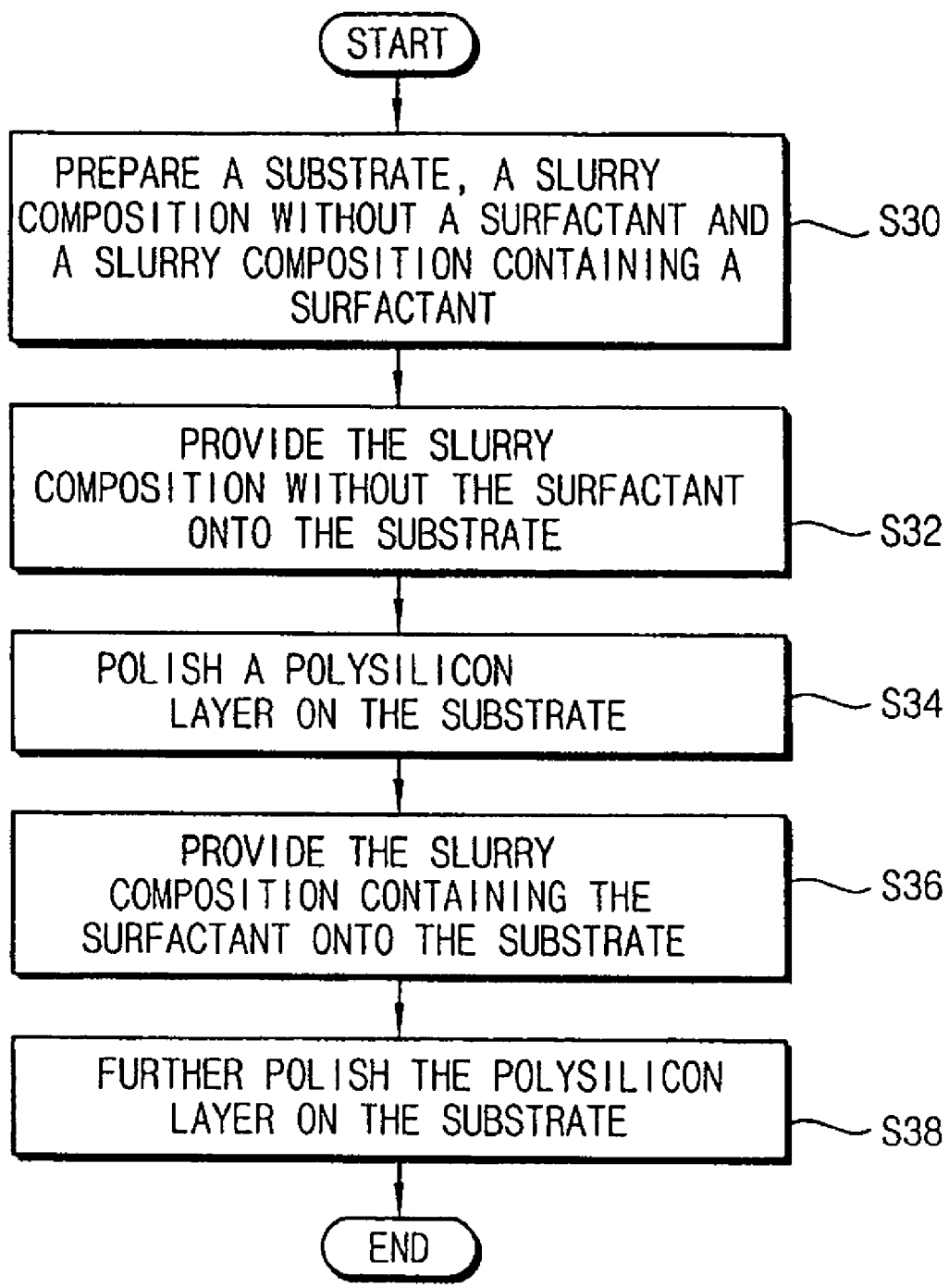
FIG. 8 illustrates a flow chart of a polishing method, in accordance with an exemplary embodiment of the present invention.

FIG. 8 illustrates a flow chart of a polishing method, in accordance with an exemplary embodiment of the present invention.

Referring to FIGS. 5 and 8, in step 30, a substrate 56, a first slurry composition without a surfactant, and a second slurry composition containing a surfactant are separately prepared. The substrate 56 may include a silicon oxide layer pattern and a polysilicon layer formed on the silicon oxide layer pattern. The silicon oxide layer pattern may serve as a polishing stop layer pattern. The polysilicon layer is polished using the first slurry composition, which lacks a surfactant.

In step 32, the substrate 56 is disposed beneath the polishing head 50 and then the first slurry composition without the surfactant is provided onto the substrate 56.

In step 34, a first chemical mechanical polishing process is performed on the polysilicon layer to polish an upper portion of the polysilicon layer. During the first chemical mechanical polishing process, the substrate 56 and the polishing pad 41 may be moved relative to each other while the polishing pad 41 makes contact with the substrate 56. As a result, after the first chemical mechanical polishing process, the polysilicon layer is reduced in height. The polysilicon layer has a polished height which may be substantially lower than that of its initial height. For example, the first chemical mechanical polishing process may be carried out to polish the polysilicon layer until the polysilicon layer has a height of about 1,000 Å, as measured from a surface of the silicon oxide layer pattern.

In step 36, the second slurry composition, which contains a surfactant, is subsequently provided onto the polysilicon layer, which is now reduced in height from its initial height.

In step 38, a second chemical mechanical polishing process is performed on the polysilicon layer to further polish the polysilicon layer, and is continued until the silicon oxide layer pattern is exposed. In the second chemical mechanical polishing process, the substrate 56 and the polishing pad 41 may be moved with respect to each other while the polishing pad 41 makes contact with the substrate 56.

Since the first chemical mechanical polishing process is carried out using the slurry composition without a surfactant, an upper portion of the polysilicon layer may be rapidly removed. In addition, because the second chemical mechanical polishing process is performed using the slurry composition containing the surfactant, dishing of the polysilicon layer may be prevented during the second chemical mechanical polishing process, and erosion of the polysilicon layer may be suppressed. Thus, polishing uniformity of the polysilicon layer on the substrate 56 may be improved.

Method of Forming a Gate Pattern

FIGS. 9 to 14 illustrate cross-sectional views of stages in a method for forming a gate pattern, in accordance with an exemplary embodiment of the present invention.

Figure 9:
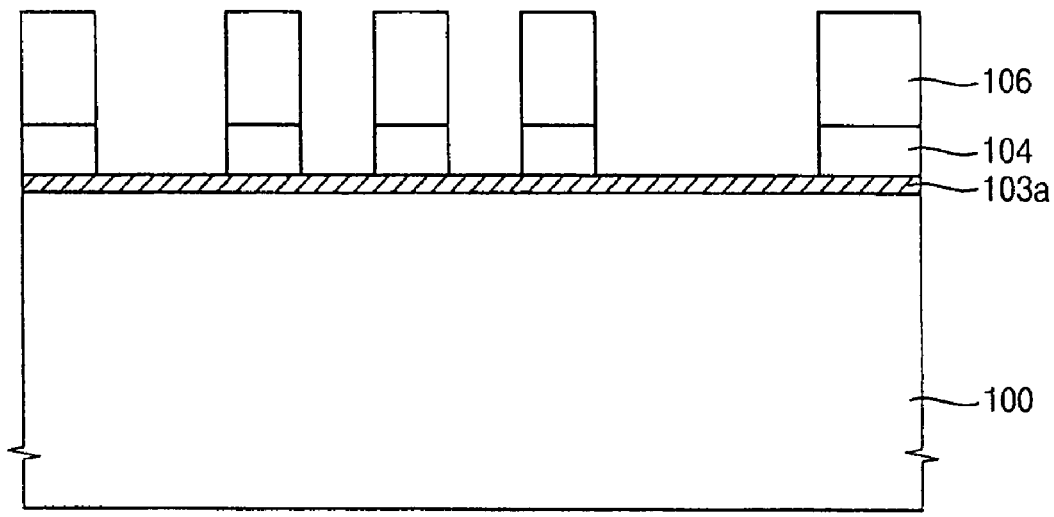
FIGS. 9 to 14 illustrate cross-sectional views of stages in a method of forming a gate pattern, in accordance an exemplary embodiment of the present invention.

Referring to FIG. 9, a thin tunnel oxide layer 103a is formed on a semiconductor substrate 100, e.g., by a thermal oxidation process or a chemical vapor deposition (CVD) process.

A silicon nitride layer (not shown) may be formed on the tunnel oxide layer 103, e.g., by a low pressure chemical vapor deposition (LPCVD) process or a plasma enhanced chemical vapor deposition (PECVD) process. The silicon nitride layer may be formed, e.g., using dichlorosilane (DCS; $SiH_2Cl_2$) gas and ammonia ($NH_3$) gas.

After a photoresist pattern 106 defining a trench 107 (see FIG. 10) is formed on the silicon nitride layer, the silicon nitride layer may be partially etched using the photoresist pattern 106 as an etching mask, to thereby form a silicon nitride layer pattern 104 on the tunnel oxide layer 103.

Figure 10:
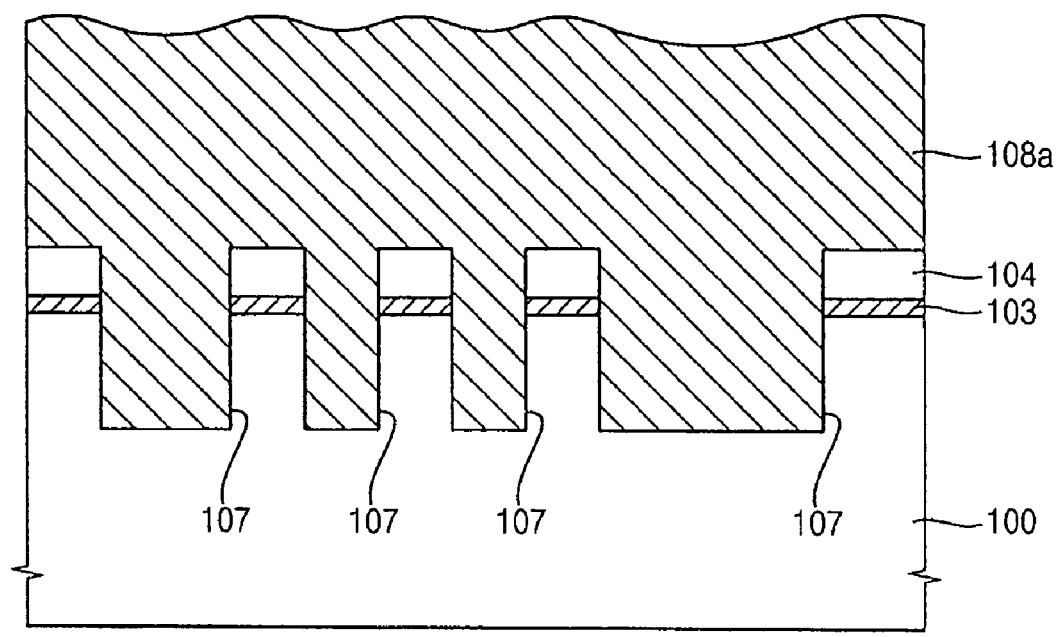

Referring to FIG. 10, after the photoresist pattern 106 is removed, e.g., by an ashing process and/or a stripping process, the tunnel oxide layer 103a and the semiconductor substrate 100 may be partially etched, e.g., using the silicon nitride layer pattern 104 as an etching mask, thereby forming a tunnel oxide layer pattern 103a and one or more trenches 107. As a result, the tunnel oxide layer pattern 103 is formed beneath the silicon nitride layer pattern 104, and the trench 107 is formed at a portion of the semiconductor substrate 100 between elements of the silicon nitride layer patterns 104.

A layer 108a, e.g., an oxide layer, may be formed on the substrate 100 to cover the silicon nitride layer pattern 104 and fill the trench 107. The oxide layer 108a may be formed from a variety of materials, including boro-phosphor silicate glass (BPSG), phosphor silicate glass (PSG), undoped silicate glass (USG), spin on glass (SOG), plasma enhanced-tetraethylorthosilicate (PE-TEOS), high density plasma-chemical vapor deposition (HDP-CVD) oxide, etc. Accordingly, in an embodiment, the oxide layer 108a may be formed using HDP-CVD oxide.

Figure 11:
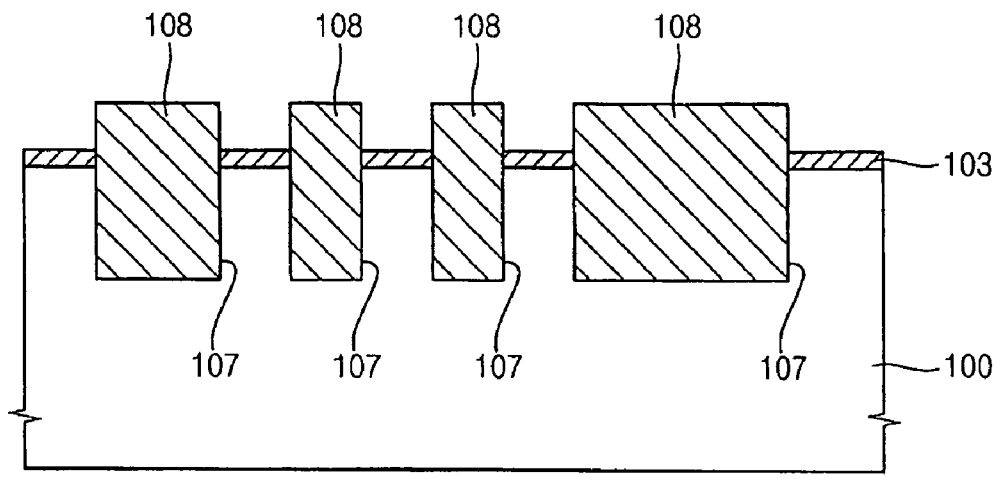

Referring to FIG. 11, the oxide layer 108a is partially removed, e.g., by an etch-back or a chemical mechanical polishing process, until the silicon nitride layer pattern 104 is exposed, thereby patterning oxide layer 108a into an isolation pattern 108, which is formed in the trench 107.

The silicon nitride layer pattern 104 may then be removed from the tunnel oxide layer pattern 103. The silicon nitride layer pattern 104 may be removed using, e.g., an etching solution including phosphoric acid ($H_3PO_4$).

Once the silicon nitride layer pattern 104 is removed, the isolation pattern 108 may have an upper face substantially higher than an upper face of the tunnel oxide layer pattern 103. That is, the isolation pattern 108 protrudes above the tunnel oxide layer pattern 103.

Figure 12:
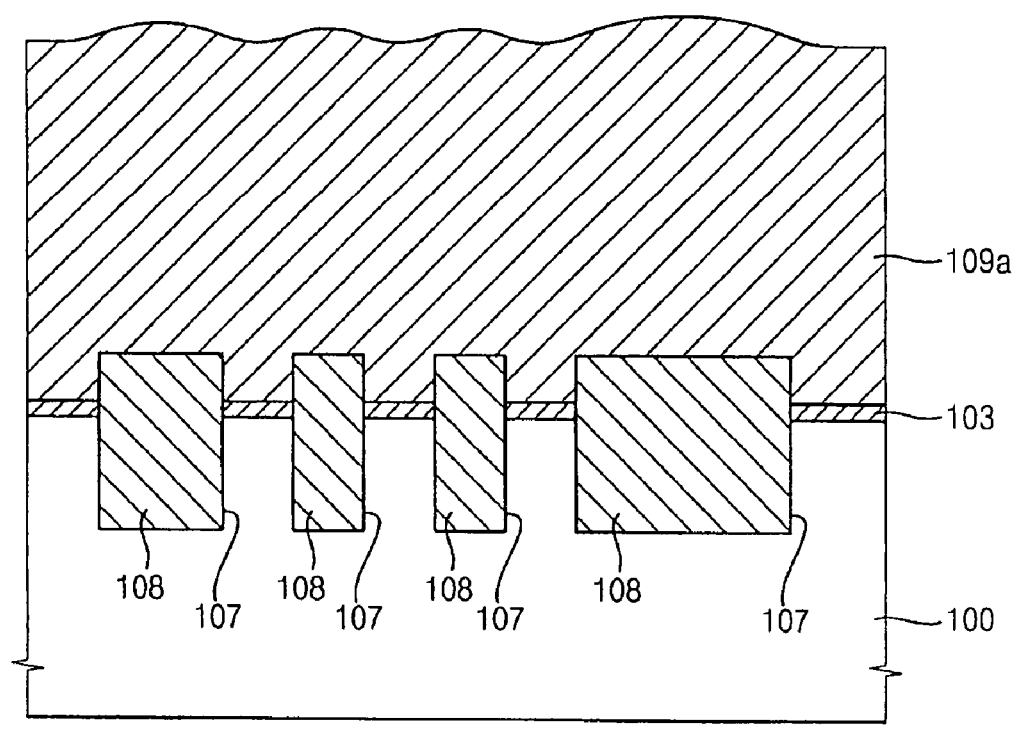

Referring to FIG. 12, a first polysilicon layer 109a may be formed on the substrate 100 to cover the tunnel oxide layer pattern 103. The first polysilicon layer 109a may be formed, e.g., using doped polysilicon by a CVD process. In some embodiments, impurities may be doped, e.g., by a diffusion process, an ion implantation process or an in-situ doping process, to form the first polysilicon layer 109a including doped polysilicon. The first polysilicon layer 109a may completely fill gaps between elements of isolation pattern 108.

Figure 13:
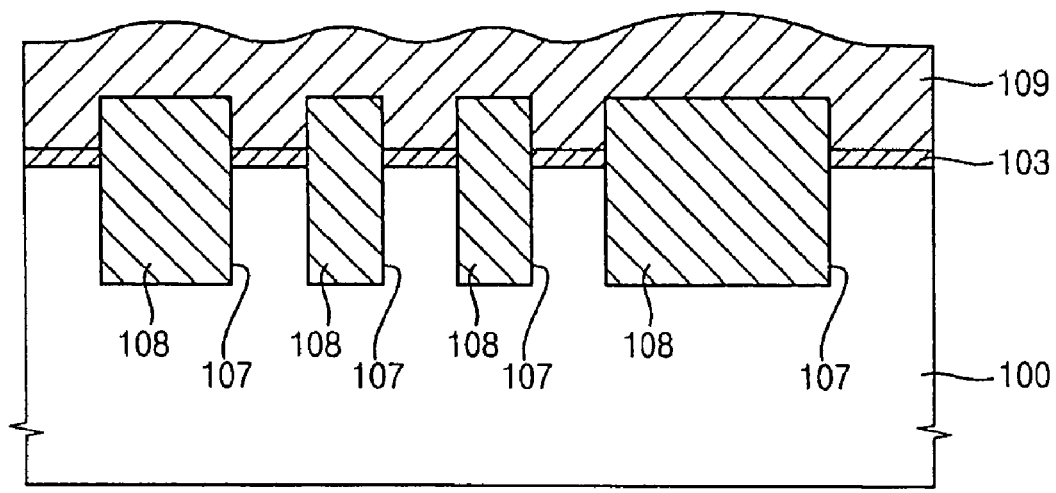

Referring to FIG. 13, semiconductor substrate 100 is processed by fixing it beneath a polishing head of a chemical mechanical polishing apparatus and providing a slurry composition, without a surfactant, onto the polysilicon layer 109a.

A first chemical mechanical polishing process may be performed on the polysilicon layer 109a to remove an upper portion of the polysilicon layer 109a using the slurry composition, which lacks surfactant. During the first chemical mechanical polishing process, the semiconductor substrate 100 and the polishing pad may be moved with respect to each other while the pad makes contact with the polysilicon layer 109a. Thus, a remaining polysilicon layer 109 may be reduced in height, relative to the isolation pattern 108 and the tunnel oxide layer pattern 103. That is, the polysilicon layer 109a may be partially removed. As a result, the polysilicon layer 109a may be reduced in thickness relative to its initial thickness. The first chemical mechanical polishing process may be carried out, e.g., until the remaining polysilicon layer 109 is about 1,000 Å thick, as measured from the isolation pattern 108.

Figure 14:
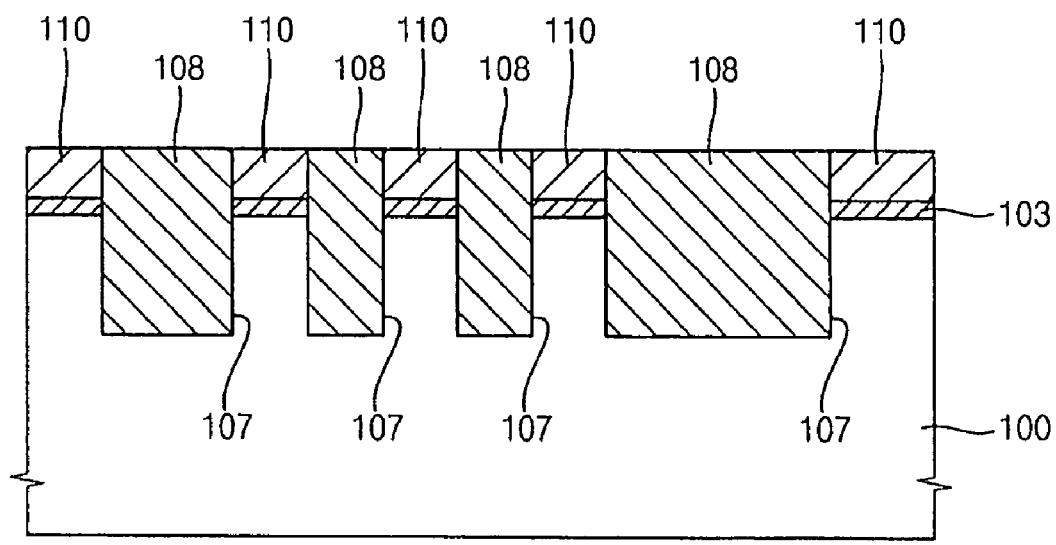

Referring to FIG. 14, after the first chemical mechanical polishing process is completed, a slurry composition containing a surfactant may be provided onto the remaining polysilicon layer 109.

A second chemical mechanical polishing process may be carried out to polish the remaining polysilicon layer 109 until the isolation pattern 108 is exposed, with a polysilicon pattern 110 interspersed there between. During the second chemical mechanical polishing process, the semiconductor substrate 100 and the polishing pad may be moved with respect to each other while the pad makes contact with the polysilicon layer 109.

Performing the first chemical mechanical polishing process using the slurry composition, which lacks a surfactant, may allow an upper portion of the polysilicon layer 109a on the isolation pattern 108 to be rapidly removed. Performing the second chemical mechanical polishing process using the second slurry composition, which contains a surfactant, may allow polysilicon layer 109 to be polished, while preventing dishing and erosion of polysilicon layer 109. Thus, polishing uniformity of the polysilicon layer 109 may be improved.

Examples 1 to 8 of Slurry Compositions

In Examples 1 to 4, slurry compositions were prepared, including varying contents of deionized (DI) water and abrasives. In particular, the slurry compositions of Examples 1 to 4 were prepared by increasing the content of the DI water while decreasing the content of the abrasives.

The slurry composition of Example 1 includes about 80 weight percent of the DI water and about 18.5 weight percent of the abrasive. The slurry composition of Example 2 includes about 90 weight percent of the DI water and about 9.25 weight percent of the abrasive. The slurry composition of Example 3 includes about 93.3 weight percent of the DI water and about 6.55 weight percent of the abrasive. The slurry composition of Example 4 includes about 95 weight percent of the DI water and about 4.95 weight percent of the abrasive. The abrasives in the slurry compositions of Examples 1 to 4 may include, e.g., silica ($SiO_2$).

The slurry compositions of Examples 1 to 4 further includes additives. In particular, the slurry composition of Example 1 includes about 1.5 weight percent of the additive, and the slurry composition of Example 2 includes about 0.75 weight percent of the additive. The slurry composition of Example 3 includes about 0.15 weight percent of the additive, and the slurry composition of Example 4 includes about 0.05 weight percent of the additive.

In Examples 5 to 8, slurry compositions were prepared, including varying contents of DI water and abrasives. In particular, the slurry compositions of Examples 5 to 8 were prepared by increasing contents of the DI water while decreasing contents of the abrasives. Additionally, the slurry compositions of Examples 5 to 8 further include surfactants.

The slurry composition of Example 5 includes about 80 weight percent of the DI water, about 17 weight percent of the abrasive and about 2 weight percent of the surfactant. The slurry composition of Example 6 includes about 90 weight percent of the DI water, about 8.5 weight percent of the abrasive and about 1.3 weight percent of the surfactant. The slurry composition of Example 7 includes about 93.3 weight percent of the DI water, about 5.67 weight percent of the abrasive and about 0.98 weight percent of the surfactant. The slurry composition of Example 8 includes about 95 weight percent of the DI water, about 4.25 weight percent of the abrasive and about 0.74 weight percent of the surfactant. The abrasives in slurry compositions of Example 5 to 8 contained silica.

The slurry compositions of Examples 5 to 8 further includes additives. Particularly, the slurry composition of Example 5 includes about 1.0 weight percent of the additive, and the slurry composition of Example 6 includes about 0.7 weight percent of the additive. The slurry composition of Example 7 includes about 0.05 weight percent of the additive, and the slurry composition of Example 8 includes about 0.01 weight percent of the additive.

The surfactant in Examples 5-8 further includes a nonionic polymer. A chemical formula of a suitable nonionic polymer is H—$(OCH_2CH_2)_x$—$(OCH(CH_3)CH_2)_y$—$(OCH_2CH_2)_z$—OH in which x, y and z are positive integers.

Test of Polishing Polysilicon Layer

A chemical mechanical polishing process was performed on polysilicon layers formed on a blank substrate using the slurry compositions of Examples 1 to 4. Each of the polysilicon layers had an initial thickness of about 10,000 Å, and included polysilicon doped with impurities.

A MIRRA-OnTrak (manufactured by AMTA Co.) was employed as a chemical mechanical polishing apparatus, and IC1000 stack pad (manufactured by Rodel Co.) was employed as a polishing pad. A flow rate of the slurry composition was about 200 ml/min. The Mirra inner tube force, retaining ring force and membrane force were about 5.2 psi, about 6.0 psi and about 5.2 psi, respectively. Rotational velocities of the Mirra polishing table and polishing head were about 63 rpm and about 57 rpm, respectively.

Examples 1-4

Figure 15:
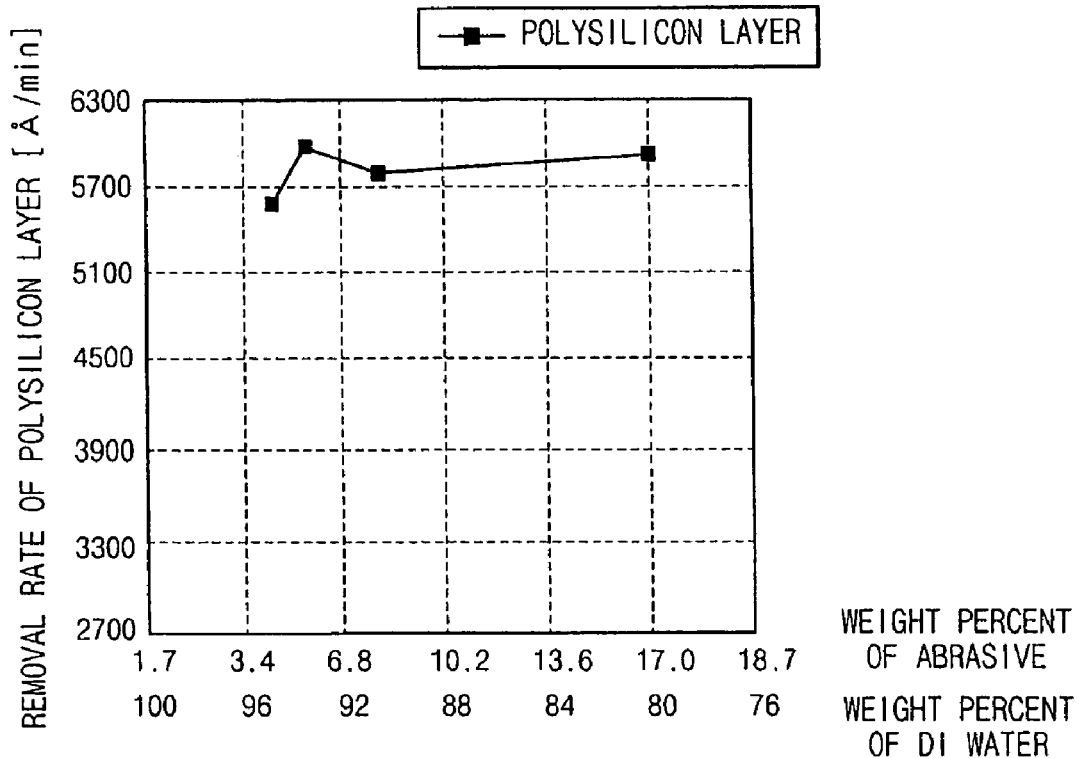
FIG. 15 is a graph illustrating removal rates of polysilicon layers according to slurry compositions of Examples 1 to 4.

Under the above-described conditions, the chemical mechanical polishing process was carried out on the polysilicon layers on the blank substrates using the slurry compositions of Examples 1 to 4. The removal rates of the polysilicon layers were measured with respect to the slurry compositions of Examples 1 to 4. These results are shown in Table 1, below. The results are also illustrated in FIG. 15. FIG. 15 is a graph illustrating removal rates of the polysilicon layers according to the slurry compositions of Examples 1 to 4.

TABLE 1

| Slurry Composition | Removal Rate of Polysilicon Layer [Å/min] | pH |
|---|---|---|
| Example 1 | 5,965 | 11.4 |
| Example 2 | 5,927 | 10.9 |
| Example 3 | 5,935 | 10.9 |
| Example 4 | 5,590 | 10.6 |

Referring to Table 1 and FIG. 15, for to the slurry compositions of Examples 1 and 2, removal rates of the polysilicon layers were about 5,965 Å/min and about 5,927 Å/min, respectively. The slurry composition of Example 1 included about 80 weight percent of the DI water and about 17 weight percent of the abrasive, and the slurry composition of Example 2 contained about 90 weight percent of the DI water and about 8.5 weight percent of the abrasive. The average removal rate of the polysilicon layers when employing slurry compositions of Examples 1 and 2 was about 5,900 Å/min.

For the slurry compositions of Examples 3 and 4, removal rates of the polysilicon layers were about 5,935 Å/min and 5,590 Å/min, respectively. The slurry composition of Example 3 included about 93.3 weight percent of the DI water and about 5.67 weight percent of the abrasive, and the slurry composition of Example 4 included about 95 weight percent of the DI water and about 4.25 weight percent of the abrasive. The average removal rate of the polysilicon layers when employing the slurry compositions of Examples 3 and 4 was about 5,762 Å/min, which is substantially less than that of Examples 1 and 2.

When the polysilicon layers are polished using the slurry compositions of Examples 1 and 2, the polysilicon layers are more rapidly polished. Thus, the time required for polishing the polysilicon layers may be reduced.

Examples 5-8

A chemical mechanical polishing process was performed on polysilicon layers and silicon oxide layers formed on blank substrates using the slurry compositions of Examples 5 to 8.

Each of the polysilicon layers had an initial thickness of about 10,000 Å and each of the silicon oxide layers had an initial thickness of about 2,000 Å. Each of the polysilicon layers included polysilicon doped with impurities, and each of the silicon oxide layers included PE-TEOS.

The MIRRA-OnTrak was again employed as the chemical mechanical polishing apparatus, and the An IC1000 stack pad was again employed as the polishing pad.

A flow rate of the slurry composition was about 200 ml/min. The Mirra inner tube force, retaining ring force and membrane force were about 5.2 psi, about 6.0 psi and about 5.2 psi, respectively. Rotational velocities of the Mirra polishing table and polishing head were about 63 rpm and about 57 rpm, respectively.

Under the above-described conditions, the chemical mechanical polishing process was performed on the polysilicon layers and the silicon oxide layers using the slurry compositions of Examples 5 to 8. Removal rates of the polysilicon layers and the silicon oxide layers were measured. Additionally, polishing selectivity between the polysilicon layers and the silicon oxide layers was measured.

Figure 16:
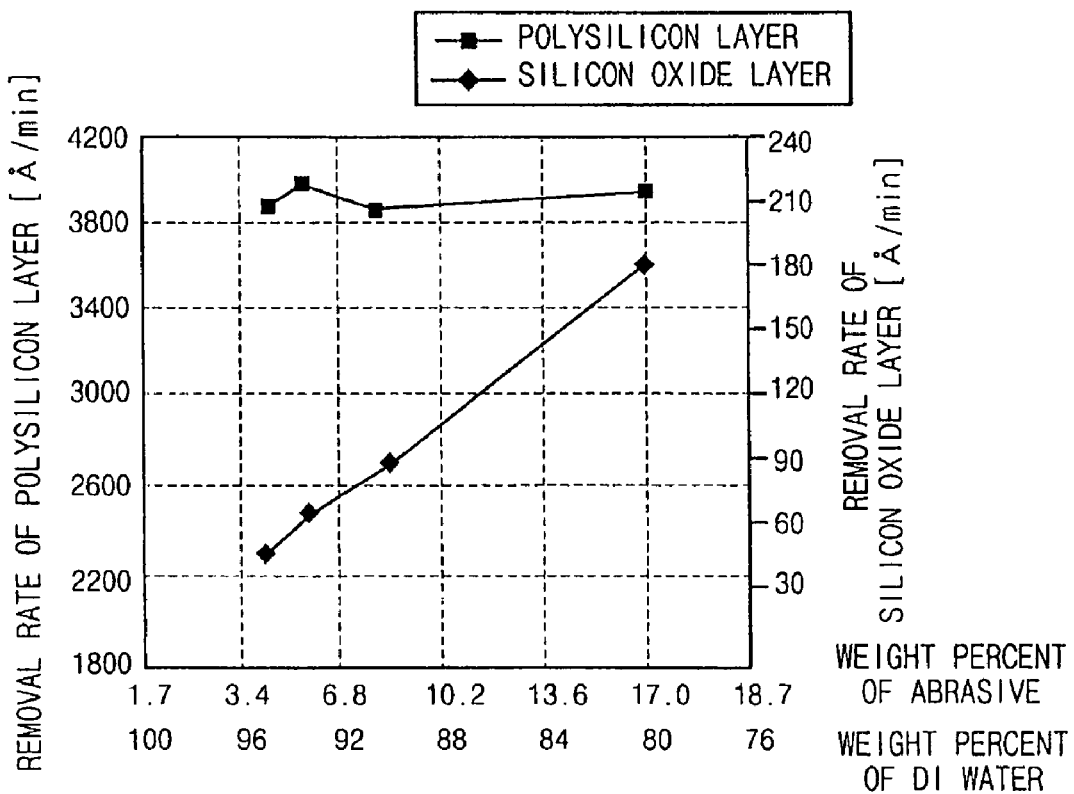
FIG. 16 is a graph illustrating removal rates of polysilicon layers and silicon oxide layers according to slurry compositions of Examples 5 to 8.
Figure 17:
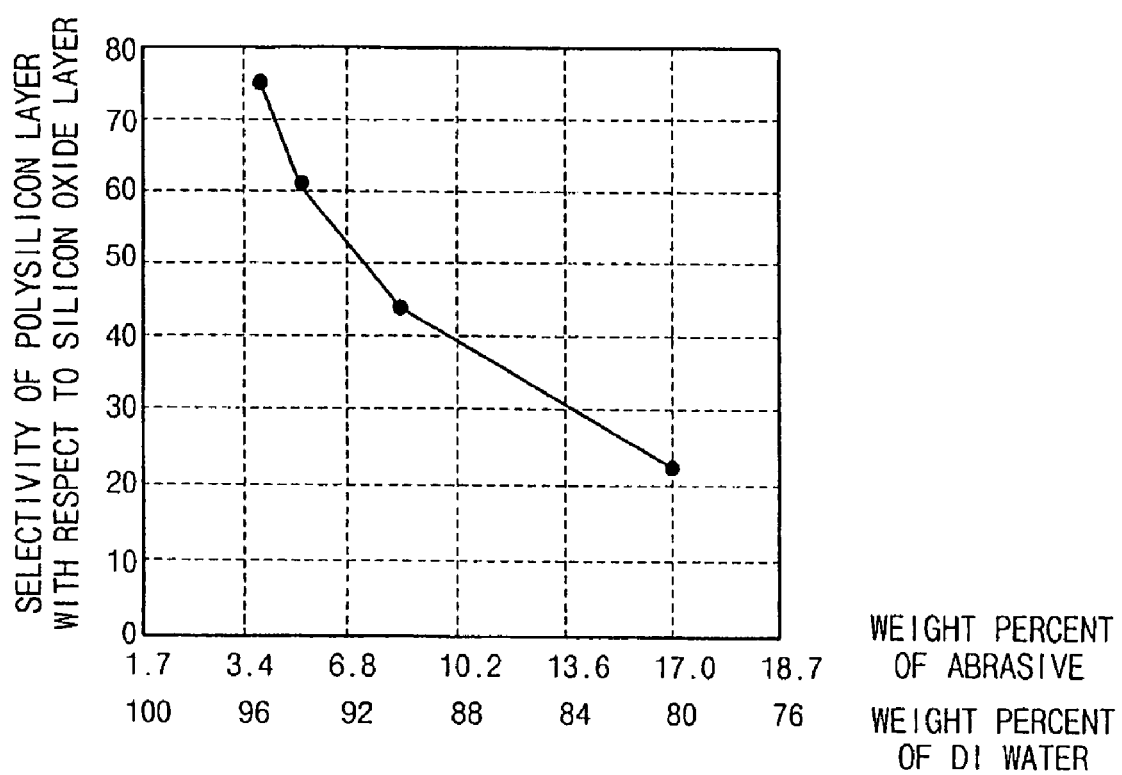
FIG. 17 is a graph illustrating polishing selectivity between polysilicon layers and silicon oxide layers according to the slurry compositions of Examples 5 to 8.

These results are shown in the Table 2, below. These results are also illustrated in FIGS. 16 and 17. FIG. 16 is a graph illustrating the removal rates of the polysilicon layers and the silicon oxide layers with respect to the slurry compositions of Examples 5 to 8. FIG. 17 is a graph illustrating polishing selectivity of the polysilicon layers and the silicon oxide layers with respect to the slurry compositions of Examples 5 to 8.

TABLE 2

| Slurry Composition | Removal Rate [Å/min] | | Polishing Selectivity | pH |
|---|---|---|---|---|
| | Polysilicon Layer | Silicon Oxide Layer | | |
| Example 5 | 3,957 | 177 | 22:1 | 11.5 |
| Example 6 | 3,885 | 88 | 44:1 | 11.0 |
| Example 7 | 3,957 | 65 | 61:1 | 10.9 |
| Example 8 | 3,844 | 50 | 77:1 | 10.8 |

Referring to Table 2 and FIG. 16, the removal rates of the polysilicon layers for the slurry compositions of Examples 5 to 8 were about 3,957 Å/min, about 3,885 Å/min, about 3,957 Å/min and about 3,844 Å/min, respectively. The removal rates of the polysilicon layers were in a desired range. The removal rates of the silicon oxide layers for the slurry compositions of Examples 5 to 8 were about 177 Å/min, about 88 Å/min, about 65 Å/min and about 50 Å/min, respectively. The removal rates of the silicon oxide layers decreased notably with increasing DI water content and decreasing abrasives content.

Referring to FIG. 17, when the slurry compositions of Examples 5 to 8 were used for polishing the polysilicon layers, polishing selectivity between the polysilicon layers and the silicon oxide layers were about 22:1, about 44:1, about 61:1 and about 77:1, respectively. The polishing selectivity increased as the content of the abrasives decreased and as the content of the DI water increased.

These results illustrate that when the content of the DI water increased/content of the abrasives decreased, the removal rates of the polysilicon layers remained relatively constant, whereas the removal rates of the silicon oxide layers decreased notably. Thus, the polishing selectivity between the polysilicon layers and the silicon oxide layers gradually increased with increasing DI water content and decreasing abrasive content.

Silicon atoms included in surface portions of the polysilicon layers may react with alkaline components included in the slurry compositions of Examples 5 to 8, so that surface portions of the polysilicon layers may be chemically removed. In addition, when the slurry compositions of Examples 5 to 8 are provided onto the polysilicon layers, the surface portions of the polysilicon layers may be softened by the chemical reactions between the silicon atoms in the surface portions of the polysilicon layers and the alkaline components in the slurry compositions. Therefore, the surface portions of the polysilicon layers may be easily removed. That is, the surface portions of the polysilicon layers may be mainly chemically polished. Though the content of the DI water increased and the content of the abrasive decreased in Examples 5-8, respectively, the content of the chemical components included in the slurry compositions of Examples 5 to 8 were maintained in a predetermined range. Therefore, the removal rates of the polysilicon layers, which mainly relate to chemical removal rates, remained relatively constant.

On the other hand, the silicon oxide layers may be mainly mechanically polished by the abrasives or protrusions of the polishing pad. That is, the silicon oxide layers may be relatively resistant to reaction between the alkaline components in the slurry compositions and silicon atoms in surface portions of the silicon oxide layers. Therefore, in Examples 5-8, as the content of the DI water increased and the content of the abrasives decreased, the removal rates of the silicon oxide layers, which mainly relate to mechanical polishing rates, were notably reduced. This is evident in the results found for the slurry compositions of Examples 7 and 8, which exhibit relatively high polishing selectivity between the polysilicon layers and the silicon oxide layers (the polishing selectivity of the slurry compositions according to Examples 7 and 8 were about 61:1 and about 77:1, respectively). The slurry composition of Example 7 included about 5.67 weight percent of the abrasive, about 93.3 weight percent of the DI water, about 0.98 weight percent of the surfactant and about 0.05 weight percent of an organic alkali as the additive. In addition, the slurry composition of Example 8 contained about 4.25 weight percent of the abrasive, about 95 weight percent of the DI water, about 0.74 weight percent of the surfactant and about 0.01 weight percent of an organic alkali as the additive When the slurry compositions having high polishing selectivity between the polysilicon layers and the silicon oxide layers are used in the chemical mechanical polishing process, erosion of the polysilicon layers due to low polishing selectivity may be prevented, so that polishing uniformity of the polysilicon layers may be improved.

When the slurry composition having high polishing selectivity are used, however, dishing of the polysilicon layers may occur at surface portions of the polysilicon layers. To suppress the dishing of the polysilicon layers, surfactants including the nonionic polymer may be added to the slurry compositions. Therefore, although the slurry compositions having the high polishing selectivity are used for the polysilicon layers, the nonionic polymer may effectively protect the polysilicon layers, thereby preventing dishing of the polysilicon layers.

According to exemplary embodiments of the present invention, a chemical mechanical polishing process may be performed on a polysilicon layer using a slurry composition having high removal rate of the polysilicon layer, so that the polysilicon layer may be rapidly polished.

According to exemplary embodiments of the present invention, a chemical mechanical polishing process may be performed on a polysilicon layer using a slurry composition having high polishing selectivity between the polysilicon layer and a silicon oxide layer, to efficiently protect the polysilicon layer so that dishing of the polysilicon layer may be suppressed. In addition, erosion of the polysilicon layer may be prevented, so that polishing uniformity of the polysilicon layer may be improved.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A polishing method, comprising:
providing a polysilicon layer on a silicon oxide pattern;
providing a first slurry composition onto the polysilicon layer, the first slurry composition comprising about 4.25 to about 18.5 weight percent of an abrasive, about 80 to about 95 weight percent of deionized water, and about 0.05 to about 1.5 weight percent of an additive;
polishing the polysilicon layer by a chemical mechanical polishing process using the first slurry composition, such that a portion of the polysilicon layer remains to cover the silicon oxide layer;
providing a second slurry composition having a different content than the first slurry composition onto the polysilicon layer, the second slurry composition including a surfactant; and
polishing the polysilicon layer using the second slurry composition, such that the silicon oxide pattern is exposed.

2. The method as claimed in claim 1, wherein the abrasive comprises at least one material selected from the group consisting of silica, ceria, alumina, titania, zirconia, and germania.

3. The method as claimed in claim 1, wherein the additive comprises at least one material selected from the group consisting of potassium hydroxide, sodium hydroxide, ammonium hydroxide, and an amine compound.

4. The method as claimed in claim 3, wherein the amine compound comprises at least one material selected from the group consisting of quaternary ammonium, quaternary ammonium salt, ethanol amine, dimethanolamine, trimethanol amine, ethylene diamine, cetyltrimethyl ammonium bromide, and cetylpyridinium chloride.

5. The method as claimed in claim 4, wherein the quaternary ammonium comprises at least one material selected from the group consisting of tetramethyl ammonium hydroxide, tetraethyl ammonium hydroxide, tetramethyl ammonium chloride, tetraethyl ammonium chloride, tetramethyl ammonium fluoride, and tetraethyl ammonium fluoride.

6. The method as claimed in claim 1, wherein
the second slurry composition includes about 0.74 to about 2.0 weight percent of the surfactant.

7. The method as claimed in claim 6, wherein the abrasive comprises at least one material selected from the group consisting of silica, ceria, alumina, titania, zirconia, and germania.

8. The method as claimed in claim 7, wherein the additive comprises at least one material selected from the group consisting of potassium hydroxide, sodium hydroxide, ammonium hydroxide, and an amine compound.

9. The method as claimed in claim 6, wherein the surfactant comprises a nonionic polymer.

10. The method as claimed in claim 9, wherein the nonionic polymer comprises at least one material selected from the group consisting of a block copolymer of polyethylene glycol and polypropylene glycol, a random copolymer of polyethylene glycol and polypropylene glycol, a block copolymer of polyethylene oxide and polypropylene oxide, and a random copolymer of polyethylene oxide and polypropylene oxide.

11. The method as claimed in claim 9, wherein the nonionic polymer has a chemical formula of $H-(OCH_2CH_2)_x-(OCH(CH_3)CH_2)_y-(OCH_2CH_2)_z-OH$, and wherein x, y, and z are positive integers.

12. The polishing method as claimed in claim 1, wherein providing the second slurry composition includes providing a slurry composition having the surfactant and a lower content of additive as compared to the first slurry composition.

13. The method as claimed in claim 12,
wherein the second slurry composition includes about 4.25 to about 18.5 weight percent of an abrasive, about 80 to about 95 weight percent of deionized water, about 0.01 to about 1.0 weight percent of an additive, and about 0.74 to about 2.0 weight percent of the surfactant.

14. The method as claimed in claim 13, wherein each of the abrasives of the slurry composition and the another slurry composition comprises at least one material selected from the group consisting of silica, ceria, alumina, titania, zirconia, and germania.

15. The method as claimed in claim 13, wherein each of the additives of the first and the second slurry compositions comprises at least one material selected from the group consisting of potassium hydroxide, sodium hydroxide, ammonium hydroxide, and an amine compound.

16. The method as claimed in claim 15, wherein the amine compound comprises at least one material selected from the group consisting of quaternary ammonium, quaternary ammonium salt, ethanol amine, dimethanolamine, trimethanol amine, ethylene diamine, cetyltrimethyl ammonium bromide, and cetylpyridinium chloride.

17. The method as claimed in claim 16, wherein the quaternary ammonium comprises at least one material selected from the group consisting of tetramethyl ammonium hydroxide, tetraethyl ammonium hydroxide, tetramethyl ammonium chloride, tetraethyl ammonium chloride, tetramethyl ammonium fluoride, and tetraethyl ammonium fluoride.

18. The method as claimed in claim 13, wherein the surfactant of the second slurry composition comprises a nonionic polymer.

19. The method as claimed in claim 18, wherein the nonionic polymer comprises at least one material selected from the group consisting of a block copolymer of polyethylene glycol and polypropylene glycol, a random copolymer of polyethylene glycol and polypropylene glycol, a block copolymer of polyethylene oxide and polypropylene oxide, and a random copolymer of polyethylene oxide and polypropylene oxide.

20. The polishing method as claimed in claim 18, wherein the nonionic polymer has a chemical formula of $H-(OCH_2CH_2)_x-(OCH(CH_3)CH_2)_y-(OCH_2CH_2)_z-OH$, and wherein x, y, and z are positive integers.

21. The polishing method as claimed in claim 1, wherein providing the first slurry composition includes providing a slurry composition without a surfactant.

* * * * *